(12) United States Patent
Watanabe

(10) Patent No.: US 6,526,094 B1
(45) Date of Patent: Feb. 25, 2003

(54) PWM CIRCUIT

(75) Inventor: Masataka Watanabe, Niigata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/201,969

(22) Filed: Dec. 1, 1998

(30) Foreign Application Priority Data

Dec. 1, 1997 (JP) ............................................. 9-330481

(51) Int. Cl.⁷ ................................................ H03K 9/08
(52) U.S. Cl. ....................... 375/238; 370/205; 370/212; 332/109; 358/443
(58) Field of Search ........................... 375/238; 327/31, 327/172; 329/312; 370/205, 212; 332/109; 358/443

(56) References Cited

U.S. PATENT DOCUMENTS

| | | | | |
|---|---|---|---|---|
| 4,502,024 A | * | 2/1985 | Nishikawa et al. | ......... 332/109 |
| 4,870,499 A | * | 9/1989 | Suzuki et al. | ............... 358/443 |
| 5,485,487 A | * | 1/1996 | Orbach et al. | ............... 375/238 |
| 5,905,406 A | * | 5/1999 | Sugden et al. | ............... 329/312 |

FOREIGN PATENT DOCUMENTS

| | | |
|---|---|---|
| JP | 61-99412 | 5/1986 |
| JP | 62-60306 | 3/1987 |
| JP | 4233601 | 8/1992 |
| JP | 6214523 | 8/1994 |
| JP | 7177038 | 7/1995 |
| JP | 7264052 | 10/1995 |

* cited by examiner

Primary Examiner—Shuwang Liu
(74) Attorney, Agent, or Firm—Dickstein, Shapiro, Morin & Oshinsky, LLP.

(57) ABSTRACT

A PWM (Pulse Width Modulation) circuit of the present invention includes a reference pulse sequence generating section for outputting a reference pulse sequence, an up-down counter, a trigger signal generating section for generating from an input signal a trigger signal for the up-down counter having a period which is a natural number multiple of one cycle the period of PWM, and a comparator for comparing the output of the up-down counter and the reference pulse sequence.

6 Claims, 3 Drawing Sheets

PWM CIRCUIT

BACKGROUND OF THE INVENTION

The present invention relates to a PWM (Pulse Width Modulation) circuit for outputting a PWM signal by executing logical operation of a reference pulse sequence and comparison pulse sequence.

A conventional PWM circuit includes a reference pulse sequence based on a reference clock, and a comparison pulse sequence generating section for generating a comparison pulse sequence. To vary a PWM pulse width while in operation, the PWM circuit varies the value of the comparison pulse sequence generating section.

Japanese Patent Laid-Open Publication No. 61-99412, for example, teaches a PWM circuit of the type varying the amplitude of a carrier signal while maintaining the amplitude of a PWM input signal constant. This type of PWM circuit includes a memory which stores data representative of PWM input signals crossing the carrier signal at each carrier period when the carrier signal has a preselected reference amplitude. A counter has a clock which is variable in portion to the ratio of the carrier signal to the reference amplitude. The counter inverts its logical value upon counting pulses for a preselected period of time at the beginning of each carrier period. In addition, means is provided for reading the data stored in the memory at the beginning of each carrier period, and for setting the data or a difference between the data and the amplitude of the carrier signal in the counter.

Japanese Patent Laid-Open Publication No. 6-214523 discloses an automatic contrast adjusting device for an LCD (Liquid Crystal Display). The adjusting device references a character table listing a relation between the output and the LCD drive voltage. A CPU (Central Processing Unit) sets a count for the high level period of PWM pulses. A contrast switch is connected to the CPU via an encoder used to vary the duty ratio of the PWM pulses set by the CPU.

The problem with the above conventional PWM circuit is that when the user desires to adjust the PWM value while the circuit is in operation, software processing using an MPU (Micro Processing Unit) is needed for intermediation. For example, when the user desires to adjust the contrast of an LCD, it is necessary for an MPU to obtain a factor for varying the PWM value, perform calculations, and then set a new value in the comparison pulse sequence generating section. Specifically, the conventional method which requires software is not practicable without resorting to the intermediary of a main MPU built into a computer to which the LCD is connected, or to an exclusive MPU for LCD contrast adjustment.

However, the exclusive MPU scheme complicates the circuit arrangement and increases the cost. When the main MPU of the computer is used to vary the PWM value, the LCD contrast adjustment effected by the user consumes the processing time of the computer and thereby reduces the performance of the computer. Moreover, because the main MPU of a computer generally operates at high frequency, the processing using main MPU consumes more power than the processing normally would when no t relying on the MPU. This is particularly true with a notebook-type personal computer.

Technologies relating to the present invention are also disclosed in, e.g., Japanese Patent Laid-Open Publication Nos. 62-60306, 4-233601, 7-277030, and 7-264052.

SUMMARY OF THE INVENTION

It is therefore an object of the present invention to provide a PWM circuit using a reference pulse sequence and a comparison pulse sequence which is capable of automatically varying, while in operation, the value of the comparison pulse sequence by automatic hardware conversion without the intermediary of MPU processing.

It is another subject of the present invention to provide a PWM circuit using a reference pulse sequence and comparison pulse sequence which is capable of varying, while in operation, the value of the comparison pulse sequence by either one of automatic software or hardware conversion.

A PWM circuit of the present invention includes a reference pulse sequence generating section for outputting a reference pulse sequence, an up-down counter, a trigger signal generating section for generating in response to an input signal, a trigger signal for the up-down counter having a period which is a natural number multiple of the period of PWM, and a comparator for comparing the output of the up-down counter and the reference pulse sequence.

BRIEF DESCRIPTION OF THE DRAWINGS

The above and other objects, features and advantages of the present invention will become more apparent from the following detailed description taken with the accompanying drawings, in which.

DESCRIPTION OF THE PREFERRED EMBODIMENTS

Figure 1:
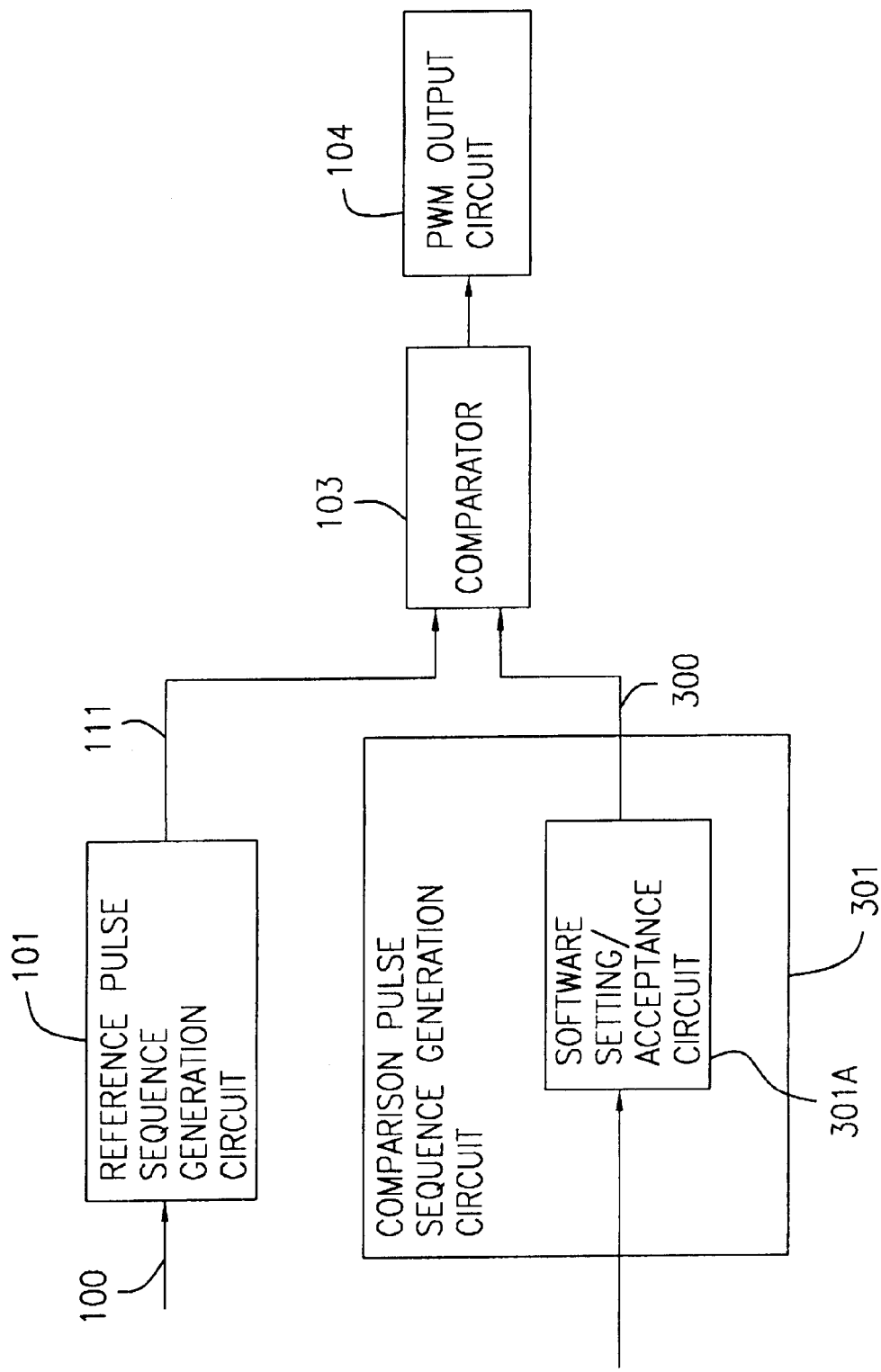
FIG. 1 is a block diagram schematically showing a conventional PWM circuit.

To better understand the present invention, brief reference will be made to a conventional PWM circuit, shown in FIG. 1. As shown, the PWM circuit includes a reference pulse sequence generation circuit 101 for outputting a reference pulse sequence 111 and a comparison pules sequence generation circuit 301 for outputting a comparison pulse sequence 200. The comparison pulse sequence generation circuit 301 includes a software setting/acceptance circuit 301A. The reference pulse sequence generation circuit 101 generates the reference pulse sequence 111 on the basis of a reference clock 100 input to its counter, not shown. The comparison pulse sequence generation circuit 301 functions to record a set value (including a value which is automatically downloaded from an exclusive memory) and to generate the comparison pulse sequence 300 by synchronizing the set value to the reference clock 100 or to one cycle per period t of PWM. C comparator 103 compares the reference pulse sequence 111 and comparison pulse sequence 300. The result of comparison is output via a PWM output circuit 104.

The above conventional PWM circuit has some problems left unsolved, as discussed earlier.

Figure 2:
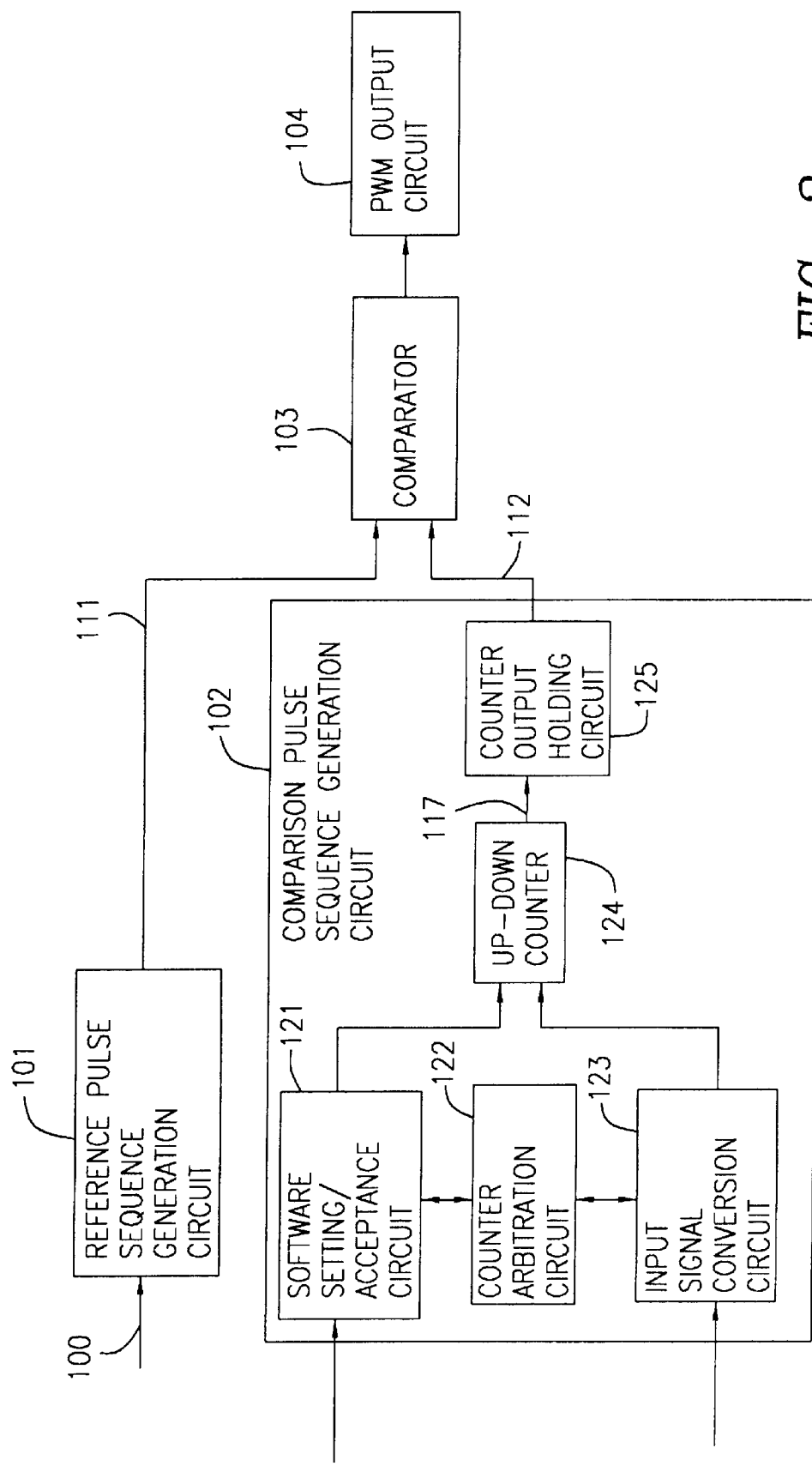
FIG. 2 is a schematic block diagram showing a PWM circuit embodying the present invention.

Referring to FIG. 2, a PWM circuit embodying the present invention will be described. As shown, the PWM circuit includes a reference pulse sequence generation circuit 101 and a comparison pulse sequence generation circuit 102 for generating a reference pulse sequence 111 and a comparison pulse sequence 112, respectively. A reference clock 100 is input to the reference pulse sequence generation circuit 101. The comparison pulse sequence generation circuit 102 is made up of a software setting/acceptance circuit 121, a counter arbitration circuit 122, an input signal conversion circuit 123, an up-down counter 124, and a counter output holding circuit 125. The up-down counter 124 and circuitry associated therewith are compatible with two kinds of components (software and hardware) for varying a PWM value. The pulse sequence generation circuits 101 and 102 are connected to a comparator 103 which is, in turn, connected to a PWM output circuit 104.

In the comparison pulse sequence generation circuit 102, the input signal conversion circuit 123, up-down counter 124 and counter output holding circuit 125 constitute means for varying a PWM value without the intermediary of an MPU customarily used to process a hardware component. In the illustrative embodiment, the PWM value is varied at a period which is N (natural number set by the user) times as great as one cycle period t of PWM. Assume that T is equal to t×N hereinafter. When the two kinds of components are both used at the same time (G), the counter arbitration or arbitrating circuit 122 gives priority to the software component for varying the PWM output value.

The input signal conversion circuit 123 converts a hardware signal, when the hardware component is used for varying the PWM value, and causes the up-down counter 124 to up-count or down-count. The PWM value can therefore be varied without the intermediary of an MPU. It follows that the circuitry of FIG. 2 saves power, compared to the prior art circuitry which relies exclusively on an MPU, and varies the PWM smoothly without affecting the performance of a computer with a PWM generation circuit even in the absence of an MPU resource.

The software setting/acceptance circuit 121 stores a value set by software processing i.e. by MPU processing. The setting/acceptance circuit 121 cooperates with the counter arbitration circuit 122 to control the input signal conversion circuit 123, up-down counter 124, and counter output holding circuit 125. This allows the PWM circuit to deal with two kinds of variation vehicles ascribable to software and hardware with a single output without scaling up the circuit.

More specifically, at the time of power-up of a computer including the above PWM circuit, an initial value is set in the up-down counter 124 via the software setting/acceptance circuit 121. Then, the input signal conversion circuit 123 generates a signal for causing the up-down counter 124 to up-count or down-count on the basis of a hardware component accepted. The comparison pulse sequence 112 output from the generation circuit 102 has its value updated at the period T which is N times as great as one cycle period t of PWM output from the reference pulse sequence generation circuit 101 (T=t×N). In practice, means is provided for synchronizing the software setting/acceptance circuit 121, input signal conversion circuit 123 and up-down counter 124 at the above period T with respect to the comparison pulse sequence 112. As for the relation between the period T and the PWM value, the following two systems are available.

The first system is such that for the unit period T, the value of the comparison pulse sequence 112 is varied on a bit-by-bit basis in order to vary the PWM value. Specifically, the input signal conversion circuit 123 processes, on a T basis, the hardware component for varying the PWM value. The factor for up-counting or down-counting is transferred to the up-down counter 124 so as to cause it to update its component at period T.

The second system is such that all the components for PWM variation may be used during the unit time T. In this case, the input signal conversion circuit 123 and up-down counter 124 are not synchronized at T. Rather, a signal sequence 117 output from the up-down counter 124 and the counter output holding circuit 125 are synchronized at T.

A single up-down counter 124 included in the illustrative embodiment varies its output in response to two kinds of components, i.e., a hardware component and a software component, as stated earlier. When the two kinds of components are used at exactly the same time, priority must be given to one or the other of them. One object of the illustrative embodiment is to reduce the load on software processing, i.e., using an MPU, by the automatic hardware conversion of PWM without using software. In this sense, usually the output PWM would not have to be varied by a software component. When the two kinds of components, however, the illustrative embodiment gives priority to the software component by determining that the conversion factor derived from software is predominant.

When a new value is set in the software setting/acceptance circuit 121 during operation, the counter arbitration circuit 122 make the conversion from the input signal conversion circuit 123 to the up-down counter 124. Specifically, the arbitration circuit 122 masks the automatic hardware conversion from the input signal conversion circuit 123 to the up-down counter 124 at the time the value from the software setting/acceptance circuit 121 is updated. The arbitration circuit 122 equalizes the value set in the setting/acceptance circuit 121 and the output of the up-down counter 124. The output of the up-down counter 124 is connected to the counter output holding circuit 125. In the illustrative embodiment, the counter output holding circuit 125 is synchronized to one cycle period t of PWM. Therefore, while the hardware conversion of the input signal conversion circuit 123 is reflected by the PWM output, the setting of the software can b reflected by the PWM output value without disturbing the waveform of one PWM period.

Figure 3:
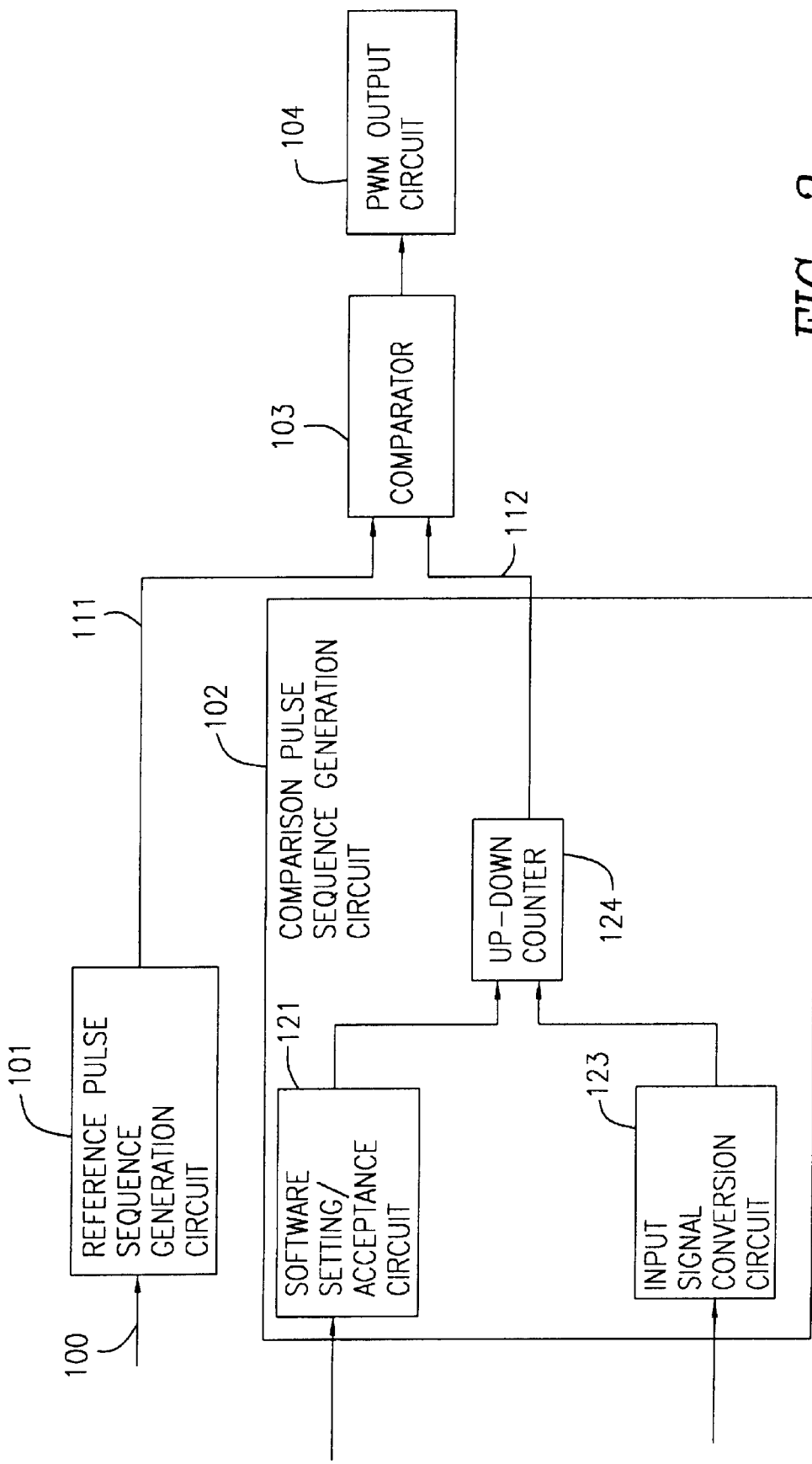
FIG. 3 is a schematic block diagram showing an alternative embodiment of the present invention.

The above embodiment may be used to control, by PWM, the contrast of LCD included in a notebook-type personal computer, as will be described with reference to FIGS. 2 and 3. While the circuitry shown in FIG. 2 is implemented by the first system described earlier, the circuitry shown in FIG. 3, however, the counter arbitration circuit 122 and counter output holding circuit 125 shown in FIG. 2 are absent.

Referring to FIG. 2, the reference pulse sequence 111 and comparison pulse sequence 112 has eight bits. In the reference pulse sequence generation circuit 101, a clock whose frequency is one half of the frequency of the basic clock 100 is input to an eight-bit counter. The output of the eight-bit counter is used as the reference pulse sequence 111. The PWM output circuit includes a flip-flop (FF hereinafter) and circuitry associated therewith. The clock 100 is also applied to the input of the FF. A result of comparison output from the comparator 103 is input to the PWM output circuit 104 as data. PWM output from the PWM output circuit 104 is therefore shifted from the reference pulse sequence 111 by one period of the clock 100. The comparison pulse sequence 112 is fed from the up-down counter 124 to the comparator 103 via the counter output holding circuit 125. This configuration corresponds to the second system.

In the illustrative embodiment, T is assumed to be equal to t on the basis of a relation between the hardware signal input to the input signal conversion circuit 123 and t. In the first system, the comparison pulse sequence 112 varies by one bit at a time every period T, causing PWM output from the PWM output circuit 104 to vary by a pulse width of 1/256 every period T.

At the time of power-up of a notebook-type personal computer, an initial value is set, in the software setting/acceptance circuit 121 and counter arbitration circuit 122 by software. After the value set in the counter arbitration circuit 122 has been reflected by the up-down counter 124 and counter output holding circuit 125, the output of the FF of the PWM output circuit 104 is validated upon the elapse of a period of time.

When a hardware signal causing the PWM value to vary is input to the input signal conversion circuit 123, the conversion circuit 123 converts the hardware signal to a signal for causing the up-down counter 124 to up-count or down-count every period T.

Assume that after the initial value has been set in the software setting/acceptance circuit 121 at the time of power-up, the user of the personal computer desires to adjust the contrast of the LCD. Then, a hardware signal derived from the user's operation, i.e., output from an LCD contrast volume or a KBC connected to an Fn key, is input to the input signal conversion circuit 123. Subsequently, the circuitry of FIG. 2 varies the value of the PWM signal without the intermediary of software (CPU processing), thereby adjusting the LCD contrast.

When a new value is set in the software setting/acceptance circuit 121 by software during operation, the illustrative embodiment executes the following processing. Assume that one cycle period of clock 100 is u, and that the new value is set in the setting/acceptance circuit 121 at a time x. Then, the counter arbitration circuit 122 performs the following operation only if there is satisfied a relation:

$$U < n \times T - x$$

(n being a natural number)

First, the arbitration circuit 122 masks the up-counting or down-counting of the counter 124 caused by the input signal conversion circuit 123. At the same time, the arbitration circuit 122 causes the counter output holding circuit 124 to reflect the value of the software setting/acceptance circuit 121 before a time nT. As a result, the value set in the setting/acceptance circuit 121 at the time x is reflected by the counter output holding circuit 125 at the time nT, i.e., reflected by the PWM value from a time (nT+u).

In the case of u>n×T−x, the comparison pulse sequence 112 for effecting PWM at the time (nT+u) reflects a value generated by the input signal conversion circuit 123. As a result, the output PWM reflects the value set in the setting/acceptance circuit 121 from a time ((n+1)T+u). From the time (T+u) to the time ((n+1)T+u), the counter output holding circuit 125 holds the value of the time nT. Then, the PWM output starts reflecting the value set in the setting/acceptance circuit 121 at the time ((n+1)T+u). Such a procedure is executed by the arbitration circuit 122. In this manner, after a new value has been set in the setting/acceptance circuit 121 by software during operation, the PWM output starts reflecting a hardware signal input to the input signal conversion circuit 123 only on the elapse of at least x to 2T.

In summary, it will be seen that the present invention provides a PWM circuit capable of varying a PWM value without the intermediary of MPU processing and therefore saving power, compared to a circuit relying exclusively on MPU processing. Because the PWM circuit of the present invention does not need an MPU resource, it can vary the PWM value smoothly without affecting the performance of a computer which has a PWM generation circuit. In addition, the set in the setting/acceptance circuit 121 by software during operation, the PWM output starts reflecting a hardware signal input to the input signal conversion circuit 123 only on the elapse of at least x to 2T.

In summary, it will be seen that the present invention provides a PWM circuit capable of varying a PWM value without the intermediary of MPU processing and therefore saving power, compared to a circuit relying exclusively on MPU processing. Because the PWM circuit of the present invention does not need an MPU resource, it can vary the PWM value smoothly without affecting the performance of a computer which has a PWM generation circuit. In addition, the PWM circuit with a single output can deal with two different kinds of components without having to be scaled up.

Various modifications will become possible for those skilled in the art after receiving the teachings of the present disclosure without departing from the scope thereof.

What is claimed is:

1. A PWM (Pulse Width Modulation) circuit comprising:
    a reference pulse sequence generator for outputting a reference pulse sequence;
    an up-down counter;
    a trigger signal generator for generating from an input signal a trigger signal for said up-down counter having a period which is an integral multiple greater than one of one cycle period of the reference pulse sequence;
    a comparator for comparing an output of said up-down counter and said reference pulse sequence;
    a holding circuit for holding an output of said up-down counter;
    a setting circuit for setting a value for said up-down counter by software; and
    an arbitrating circuit for arbitrating an operation of said up-down counter affected by said trigger signal and an asynchronous setting of said up-down counter affected by said setting circuit.

2. A PWM (Pulse Width Modulation) circuit comprising:
    a reference pulse sequence generator responsive to a master clock signal to generate a reference pulse sequence;
    an up-down counter;
    an input circuit for receiving a data variable, and for connecting a signal representative of the data variable to the up-down counter;
    a trigger signal generator responsive to the master clock signal to generate a trigger signal for the up-down counter having a period which is an integral multiple greater than one of one cycle period of the reference pulse sequence; and
    a comparator for comparing an output of said up-down counter and said reference pulse sequence.

3. A PWM circuit as claimed in claim 2, wherein the comparison pulse sequence generating circuit further comprises a holding circuit for holding an output of said up-down counter.

4. A PWM (Pulse Width Modulation) circuit comprising:
    a reference pulse sequence generator generating a reference pulse sequence in response to a master clock signal;
    a comparison pulse sequence generating circuit including:
        an up-down counter;
        a first input circuit and a second input circuit, each operative to receive and process incoming signals from separate input sources, and to provide inputs to the up-down counter;
        a control circuit operative to control the provision of inputs from the first and second input circuits to the up-down counter such that, as between incoming signals arriving substantially simultaneously at the first and second input circuits, the signal arriving at the first input circuit will be provided to the up-down counter first, and the signal arriving at the second input circuit will be delayed; and a comparator operative to compare the output of the up-down counter and the reference pulse sequence.

5. A PWM circuit as claimed in claim 4, wherein:

the second input circuit generates a trigger signal in response to the master clock signal, the trigger signal having a period which is an integral multiple of one cycle period of the reference pulse sequence, the integral multiple being greater than one;

the comparison pulse sequence generating circuit further includes a holding circuit holding an output of the up-down counter; and the control circuit includes an arbitrating circuit operative to arbitrate operation of the up-down counter affected by the trigger signal and an asynchronous setting of the up-down counter affected by an incoming signal received by the first input circuit.

6. A PWM circuit as claimed in claim 4, wherein:

the incoming signals received by the first input circuit are generated by software; and the incoming signals received by the second input circuit are generated by hardware.

* * * * *